(12) United States Patent
Hurrell (10) Patent No.: US 7,773,020 B2
(45) Date of Patent: Aug. 10, 2010

(54) ANALOG TO DIGITAL CONVERTER

(75) Inventor: Christopher Peter Hurrell, Cookham (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/069,216

(22) Filed: Feb. 8, 2008

(65) Prior Publication Data

US 2008/0198056 A1 Aug. 21, 2008

Related U.S. Application Data

(60) Provisional application No. 60/901,436, filed on Feb. 15, 2007.

(51) Int. Cl.
*H03M 1/12* (2006.01)
(52) U.S. Cl. ........................ 341/155; 341/118; 341/120; 341/143; 341/156; 341/172
(58) Field of Classification Search ......... 341/118–122, 341/143, 155, 172, 156
See application file for complete search history.

(56) References Cited

U.S. PATENT DOCUMENTS

| | | | | |
|---|---|---|---|---|
| 5,049,882 A * | 9/1991 | Gorecki et al. | ............... | 341/143 |
| 6,124,818 A * | 9/2000 | Thomas et al. | ............... | 341/155 |
| 6,172,630 B1 * | 1/2001 | Nelson | ........................ | 341/143 |
| 6,239,734 B1 | 5/2001 | Bae et al. | | |
| 6,611,222 B1 * | 8/2003 | Murphy | ...................... | 341/155 |
| 6,707,403 B1 | 3/2004 | Hurrell | | |
| 6,828,927 B1 | 12/2004 | Hurrell et al. | | |
| 7,038,609 B1 | 5/2006 | Hurrell | | |
| 7,199,743 B2 * | 4/2007 | Casper et al. | ............... | 341/150 |
| 7,218,259 B2 | 5/2007 | Hurrell et al. | | |
| 7,250,880 B2 | 7/2007 | Hurrell et al. | | |
| 7,274,321 B2 | 9/2007 | Hurrell et al. | | |
| 7,280,066 B2 * | 10/2007 | Pernici et al. | ............... | 341/172 |
| 7,286,074 B2 * | 10/2007 | Kudoh et al. | ................. | 341/162 |
| 7,286,075 B2 | 10/2007 | Hennessy et al. | | |
| 7,477,177 B2 * | 1/2009 | Kuramochi et al. | ......... | 341/156 |
| 2003/0210165 A1 * | 11/2003 | Carreau et al. | ............... | 341/141 |
| 2007/0035431 A1 * | 2/2007 | Hurrell et al. | ................ | 341/155 |
| 2008/0129573 A1 * | 6/2008 | Mueck et al. | ............... | 341/163 |
| 2008/0218393 A1 * | 9/2008 | Kuramochi et al. | ......... | 341/143 |
| 2008/0297381 A1 * | 12/2008 | Kernahan et al. | ............. | 341/51 |

OTHER PUBLICATIONS

Dabbagh-Sadeghipour, Khosrov et al, "A new architecture for area and power efficient, high conversion rate successive approximation ADCs", IEEE, 2004, pp. 253-256.
Bhandari, S.M. et al, "A successive double-bit approximation technique for analog/digital conversion", IEEE, vol. 37, No. 6, Jun. 1990, pp. 856-858.
PCT/US2008/001945, International search report and written opinion, Jun. 10, 2008.

* cited by examiner

*Primary Examiner*—Linh V Nguyen
(74) *Attorney, Agent, or Firm*—Kenyon & Kenyon LLP (57) ABSTRACT

An analog to digital converter is provided in which the outputs of first and second digital to analog converters DAC1 and DAC2 are combined in a combining circuit so as to form a plurality of decision thresholds. This enables two or more bits to be determined in a single trial.

21 Claims, 9 Drawing Sheets

3 collaborating ADCs with binary weighted caps

Correctly determines answer to be between 24 and 25
Input = 24.75

| Trial | ADC | 32 | 16 | 8 | 4 | 2 | 1 | Total | |
|---|---|---|---|---|---|---|---|---|---|
| T1 | E1 | 0 | 1 | 0 | 0 | 0 | 0 | 16 | Reject |
| T1 | E2 | 1 | 0 | 0 | 0 | 0 | 0 | 32 | Reject |
| T1 | E3 | 1 | 1 | 0 | 0 | 0 | 0 | 48 | Reject |
| T2 | E1 | 0 | 1 | 0 | 0 | 0 | 0 | 20 | |
| T2 | E2 | 0 | 1 | 1 | 0 | 0 | 0 | 24 | |
| T2 | E3 | 0 | 1 | 1 | 0 | 0 | 0 | 28 | Reject |
| T3 | E1 | 0 | 1 | 1 | 0 | 0 | 1 | 25 | Reject |
| T3 | E2 | 0 | 1 | 1 | 0 | 1 | 0 | 26 | Reject |
| T3 | E3 | 0 | 1 | 1 | 0 | 1 | 1 | 27 | Reject |
| Result | | 0 | 1 | 1 | 0 | 0 | 0 | 24 | Correct |

# ANALOG TO DIGITAL CONVERTER

FIELD OF THE INVENTION

The present invention relates to an analog to digital converter, and in particular to a converter that can determine multiple bits per bit trial.

BACKGROUND OF THE INVENTION

Users of digital to analog converters generally wish to see high conversion accuracy and high conversion rates.

Flash converters and pipeline converters are known to provide high conversion speeds. Flash converters convert an input word in a single go and exhibit only a relatively small conversion delay whereas pipeline converters segment the conversion process into multiple steps and hence can achieve high throughput, at the expense of a pipeline delay and increased complexity.

A particularly popular analog to digital converter type is the successive approximation converter. This converter represents a good compromise between cost and speed and can be made to be very accurate. A successive approximation converter performs successive bit trials to see, whether, once the bit being trialed is set if the analog value that it is seeking to convert is greater than or less than the equivalent value represented by the bit being trialed, in conjunction with the sum of any previously kept bits. Thus the successive approximation converter seeking to produce an eight bit output result performs eight bit trials (or more if the converter included redundancy).

U.S. Pat. No. 6,239,734 discloses an analog to digital converter having three converters which co-operate such that each bit trial can determine two bits within the digital word. An example shown in FIG. 7 of U.S. Pat. No. 6,239,734 discloses the conversion of a six bit word. An analog input signal is presented which has a value, when converted, that corresponds to "110011". In accordance with the normal successive approximation process a first register SAR is set to trial the word "100000". Additionally a second register SAR+ is set to trial the word "110000" and a third register SAR– is set to trial the word "010000". In this first trial the analog value is greater than each of the trial words in the SAR, SAR+ and SAR– registers and hence the first two bits of trial can be set to "11". In a second trial the two bits being tested are set to "10, 11 and 01", in the registers respectively such that the first register trials "111000", the SAR+ register trials "111100" and the SAR– register trials "110100". At the end of this second trial the analog value is less than each of the trial words hence the next two bits can be set to "00" thus four bits being determined in only two trial steps. In the third step the "10, 11 and 01" pattern is presented to each of the registers for bits five and six with the previous four bits being set to "1100" as determined by the first two trial steps. In the final steps two of the trial words are less than the analog value and the third trial word is not, thereby recovering the converted word of "110011" with the end bit word being converted in $$\frac{n}{2} \text{ trials.}$$

Thus a potential doubling of conversion speed has been achieved. However this is at the cots of having to fabricate three analog to digital conversion engines.

SUMMARY OF THE INVENTION

According to a first aspect of the present invention there is provided an analog to digital converter comprising first and second digital to analog converters, at least three comparators and a capacitive summing network for forming at least first to third combinations of output from the first and second digital to analog converters such that at least three decision thresholds can be tested at the same time.

It is thus possible to use two digital to analog converters to test two or more bits at a time.

Preferably the analog to digital converter is a successive approximation converter.

In one sense, each comparator and its summing network behaves as if it was a single successive approximation routine SAR conversion engine, and each of the conversion engines tests a value which is related to the value of all of the other conversion engines. This enables a highly parallel SAR converter to be provided using a significantly reduced number of internal digital to analog converters In order to test two bits at a time in a successive approximation conversion it is necessary to have three decision thresholds generated. However advantageously more than three decision thresholds are available such that the range tested by any subsequent conversion step (T+1th step) is greater than the inter decision threshold range of the current (Tth) step. This improves the system's capability to recover from settling errors.

It should be noted that, generally speaking, at any bit trial other than the first bit trial with just three decision thresholds the current trial space under investigation is bounded to be one quarter of the size of the previous extent of the trial space. However, when using an extra decision threshold, such that it looks as if the system has four conversion engines operating in unison, then the trial space can be made larger than one quarter of the size of the previous trial space and hence conversion errors resulting from settling and other errors can be corrected. Thus, if the bit trials are counted using an integer T, then the trial space of an T+1th bit trial is larger than one quarter of the trial space of the Tth bit trial. However, as the trial space is less than one half of the size of the preceding space then a final answer is obtained more quickly than is the case using a single SAR converter.

Advantageously, when proceeding from one trial to the next bit trial and using more than three conversion engines or three comparators, the trial range is offset. In an embodiment of the present invention the trial range is offset by a value corresponding to half of the current smallest bit size under test. This allows for errors of either sign in the conversion process to be corrected.

It should be noted that the redundancy allowed by the addition of the fourth converter engine, i.e. a fourth comparator in association with its respective summing network, provides correction of previous errors in the conversion without the cost of any additional bit trials. Of course it is possible to add redundancy while using just three conversion engines but this requires additional redundant bits to be added which incurs the cost of additional bit trials. This could, for example, be achieved by making the new trial range half, rather than one quarter, that of the previous bit trial and also offsetting the trial range to provide correction of errors of both + and – signs.

It is possible to add more comparators and summing networks such that more decision thresholds are formed. Thus if seven decision thresholds are formed (or better still eight thresholds to provide redundancy) it is possible to use the two digital to analog converters in conjunction with the seven comparators to test three bits at each conversion step. Similarly forming fifteen (or better still sixteen) decision thresholds allows four bits to be trialed at each conversion step.

According to a second aspect of the invention there is provided a method of performing an analog to digital conversion in which a Tth conversion trial determines at least two bits, the method comprising setting a first value in a first digital to analog converter and a second value in a second digital to analog converter and combining the outputs in a combinational device so as to form at least three decision thresholds, where T is a positive integer.

BRIEF DESCRIPTION OF THE DRAWINGS

The present invention will further be described, by way of example only, with reference to the accompanying drawings, in which.

DESCRIPTION OF PREFERRED EMBODIMENTS OF THE PRESENT INVENTION

Figure 1:
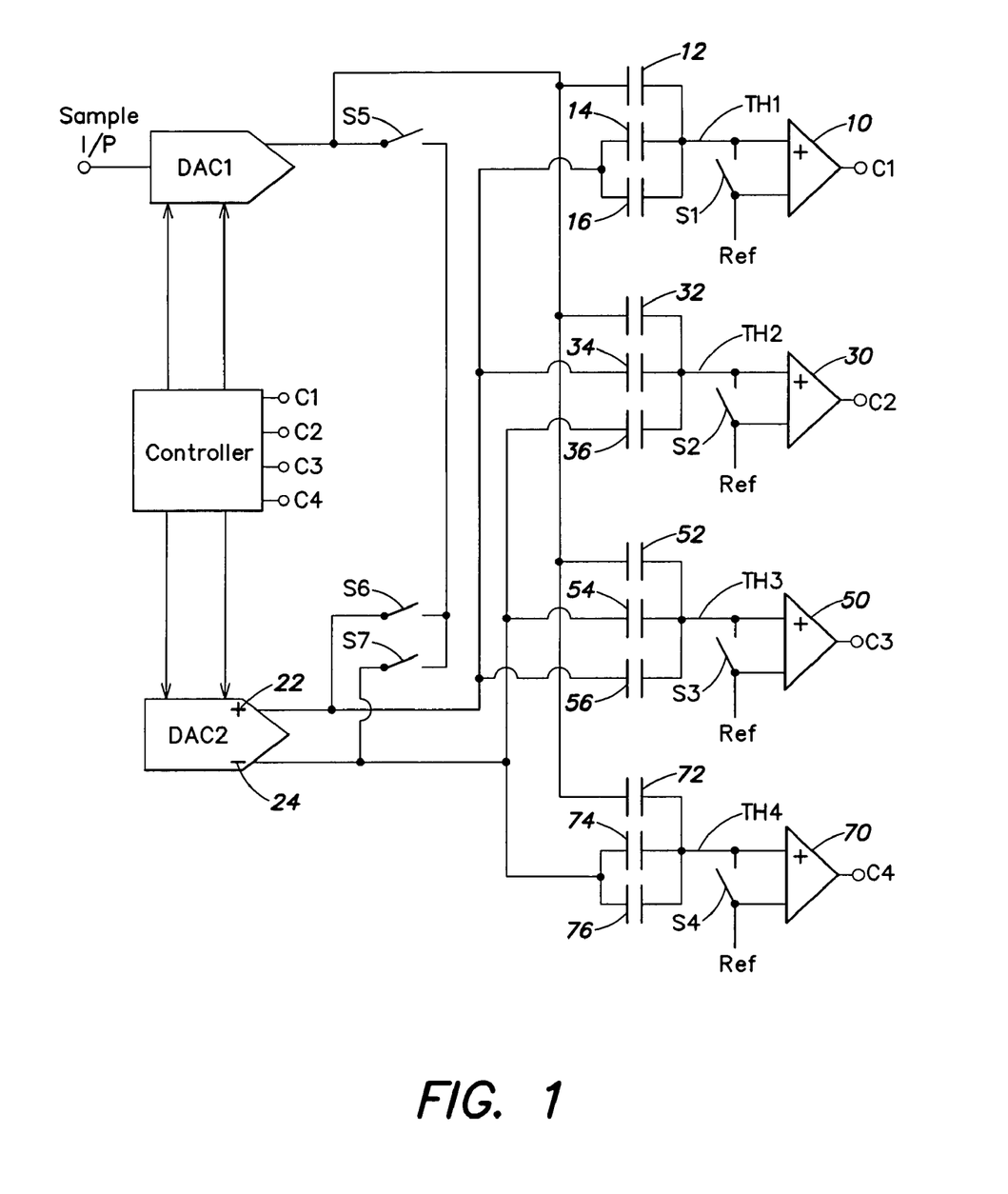
FIG. 1 schematically illustrates, in simplified form, the internal architecture of a digital to analog converter constituting an embodiment of the present invention.

FIG. 1 schematically illustrates an analog to digital converter constituting an embodiment of the present invention. The analog to digital converter comprises a first digital to analog converter, DAC1, which can be formed using any suitable converter technology but in this example is a switched capacitor digital to analog converter as such converters can also perform the task of sampling the analog input signal that is to be converted via a sample input. The converter may or may not be segmented, this is at the designers choice, and may be single ended or have a differential output. For simplicity, we shall assume that the converter is single ended. The first digital to analog converter DAC1 has its output connected via first to fourth capacitors 12, 32, 52 and 72 to first to fourth comparators 10, 30, 50 and 70 having outputs C1 to C4, respectively. In preferred embodiments of the present invention the use of four comparators allows the decision space to be extended, although as will be explained the invention can work adequately with only three decision thresholds to still convert two bits per trial.

As noted hereinbefore the first comparator 10 is connected to the first digital to analog converter DAC1 via a coupling capacitor 12. Similar coupling capacitors 32, 52 and 72 are provided to connect the output of the first digital to analog converter DAC1 to non-inverting inputs of the second to fourth comparators 30, 50, and 70. The non-inverting input of the first comparator 10 is also connected via first and second offset coupling capacitors 14 and 16 to the outputs of a second digital to analog converter DAC2 (which can be regarded as being an offset DAC) which is a differential converter. To put this in context, if the second digital to analog converter DAC2 is presented with a control word which causes its non-inverting output 22 (in the absence of a load) to assume a voltage of +1 volts then the inverting output 24 thereof would take a value of −1 volts. However, it should be noted that it is not necessary for the second digital to analog converter DAC2 to be a differential converter, as will be explained later with reference to FIG. 4. Similar coupling capacitors 34 and 36 are provided to connect the offset DAC, DAC2, to the second comparator 30, capacitors 54 and 56 are provided for the third comparator 50 and similar capacitors 74 and 76 are provided for the fourth comparator 70. Each of these capacitors is either coupled to the non-inverting output 22 or the inverting output 24 of the second digital to analog converter DAC2 in order to produce various decision thresholds offset from the voltage output from the first digital to analog converter DAC1. Each comparator can be regarded as acting like a conversion engine in that each comparator and coupling network combination effectively tests the analog value against a different trial word. In the four comparator/conversion engine example of FIG. 1, the first offset coupling capacitors 14, 34, 54 and 74 of any comparator have a value which is twice that of the respective second offset coupling capacitors 16, 36, 56 and 76. For simplicity, lets assume that the coupling capacitor 14 has a value of one arbitrary capacitance unit, 1C. Then each of the second coupling capacitors has a value of 0.5 C. In this scheme we choose the coupling capacitor 12 to have a value of 4 C. The same ratios apply for each of the other capacitors 32, 34, 36, 52, 54, 56 and 72, 74 and 76. The capacitors 14 and 16 associated with the first comparator 10 are both coupled to the non-inverting output 22 of the second digital to analog converter DAC2.

The first coupling capacitor 34 of the second comparator 30 is connected to the non-inverting output 22 of the second digital to analog converter DAC2, where as the second coupling capacitor 36 is connected to the inverting output 24 of the second digital to analog converter.

The first coupling capacitor 54 of the third comparator is connected to the inverting output 24 of the second digital to analog converter DAC2 whereas the second coupling capacitor 56 is connected to the non-inverting output 22. Finally, both the first and second coupling capacitors 74 and 76 of the fourth comparator 70 are connected to the inverting output 24 of the second digital to analog converter DAC2.

Figure 2A:
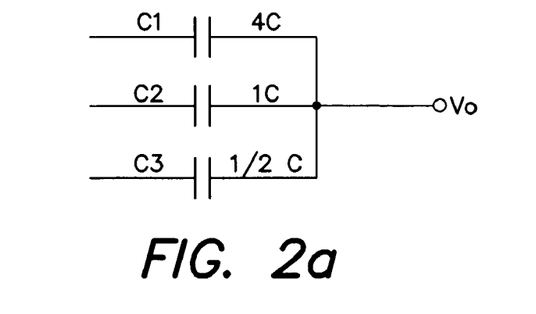
FIGS. 2a to 2d show simplified schematic diagrams of a capacitive potential divider formed at the input of the first comparator.
Figure 2B:
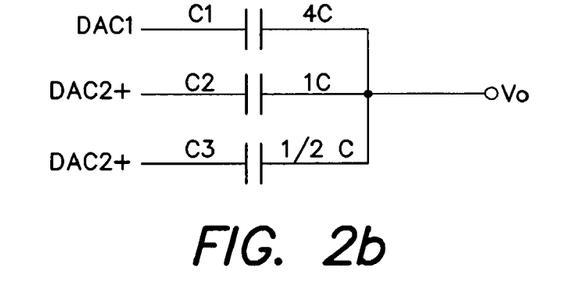

FIG. 2a shows the capacitor network coupling to the positive inputs of the 4 comparators. For the first comparator both C2 and C3 are connected in parallel to DAC2+ output as shown in FIG. 2b. The voltage at Vo can be found from:

$$VO = DAC1 \frac{C1}{(C1 + C2 + C3)} + DAC2 \frac{(C2 + C3)}{(C1 + C2 + C3)}. \qquad \text{Eqn 1}$$

It can be seen that DAC2 is multiplied by the fraction 3/11.

Figure 2C:
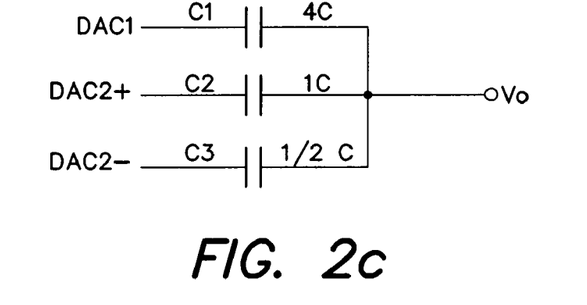

FIG. 2c shows the connection for the second comparator where C3 is now connected to DAC2− output. The voltage at Vo can then be found from:

$$VO = DAC1 \frac{C1}{(C1 + C2 + C3)} + DAC2 \frac{(C2 - C3)}{(C1 + C2 + C3)}. \qquad \text{Eqn 2}$$

In this case DAC2 is multiplied by the fraction 1/11.

Figure 2D:
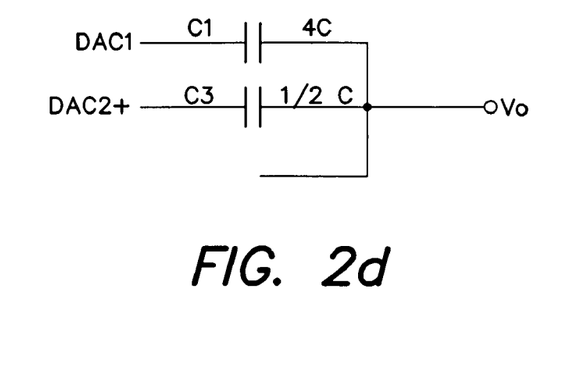

In an alternative arrangement for the capacitor network for the second comparator where C2 is dispensed with and C3 is connected to just the positive output of DAC2 as shown in FIG. 2d. The voltage at Vo is then given by:

$$VO = DAC1 \frac{C1}{(C1+C3)} + DAC2 \frac{C3}{(C1+C3)}. \quad \text{Eqn 3}$$

The denominator in the above expression has now changed from 5+½ to 4+½ giving a new multiplier for both DAC1 and DAC2. However since Vo is only being sensed by a comparator, this does not in fact matter as it is only the sign of Vo and not its magnitude that is being determined.

Similar expressions can be written for the voltages occurring at the other comparators 50 and 70 taking account of the sign from the output from the second comparator DAC2.

In the preferred arrangement C2 and C3 are set to 1 unit and ½ units respectively while C1 is set to 4 units. These values are chosen to give the correct scaling of the DAC outputs as sensed at the inputs of the comparators, assuming the 2 DACs have the same full scale range. If the range of the DAC2 could be increased, then the value of C1 could be increased or C2 and C3 could be reduced (or some combination of the both of these actions). For example if the range of DAC2 were doubled then C1 would could also be doubled to 8 units or C2 and C3 could be decreased to ¼ units and ⅛ units respectively. This has the effect of reducing the attenuation of the sampled signal, as seen at the comparator inputs.

The full scale range of the $2^{nd}$ DAC could be increased by using a larger DAC2 reference voltage or by changing the architecture of the DAC.

It can also be seen that, looking from the output of one digital to analog converter to the other that the converters regard themselves as being connected to the other by a single capacitor and hence each converter loads the other by the same amount, and hence the outputs of the digital to analog converters DAC1 and DAC2 become modified by the additional capacitive load, but each is modified by the same amount such that the relative matching of the digital to analog converters remains unaffected.

It can be seen that the voltage occurring at the input of the comparator 10 is predominantly the voltage occurring at the output of the first digital to analog converter DAC1 modified by the voltage occurring at the output of the second digital to analogue converter, DAC2. As the capacitors 14 and 16 are in parallel and both connected to the non-inverting output 22, then a change of 1.5 arbitrary units is effectively added to the output of the first digital to analog converter DAC1.

For the second comparator 30, a value of 1−0.5=0.5 units is added to the output of the first digital to analog converter DAC 1. For the third comparator a value of −1+0.5=−0.5 arbitrary units is added to the output of the first digital to analog converter DAC1, similarly for the fourth comparator 70 a value of −1.5 arbitrary units is added to the output of the first digital to analog converter. Thus four separate decision thresholds have been derived from only two digital to analog converters.

Figure 3:
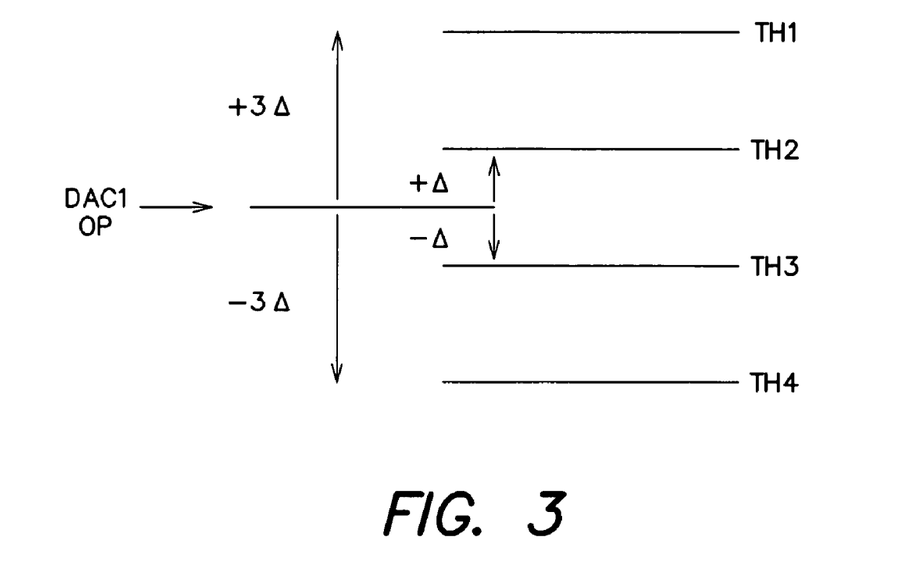
FIG. 3 schematically illustrates how four decision thresholds can be placed in a search space.

This is schematically illustrated in FIG. 3 where the output from the first digital to analog converter DAC1 is designated DAC1 OP, and is then modified by +3Δ to generate a first threshold TH1 supplied to the first comparator 10, by +Δ to generate a second threshold TH2 supplied to the second comparator 30, by −Δ to generate a third threshold TH3 supplied to the third comparator 50, and by −3Δ to generate a fourth threshold TH4 supplied to the fourth comparator 70.

In the embodiment of FIG. 1, the first and second digital to analog converters DAC1 and DAC2 have the same internal architecture for their capacitor arrays, and the capacitive divider networks act to correctly scale the contribution of DAC2 to offset the output of DAC1.

In use, if we regard each conversion trial T as testing two of the N bits that are to be converted (although it should be noted that the designer may chose the first bit trial to only test one threshold, i.e. DAC2 has no output while being supplied with a zero value control word, such that voltage excursions at the inputs to the comparators do not fall outside the device supply voltages and hence do not switch on parasitic diodes or the like which might result in charge loss from DAC1) then moving from on Tth to an T+1th conversion trial the output of DAC2 is reduced by one quarter.

Therefore, if for example we had an eight bit converter then trial T1 would determine bits N=1 and N=2 (where N=1 is the most significant bit and N=8 is the least significant bit).

During an acquire phase DAC1 would be set to 10000000 and DAC2 to 00000000. Then for the first bit trial DAC1 would remain at 10000000 and DAC2 would be switched to 11111111.

For subsequent trials the value presented on DAC1 will vary depending on the input value being converted and the resulting comparator decisions. However trial T2 determines bits N=3 and N=4 and the control word for DAC2 is 01000000 which is very nearly ¼ the previous value. With redundancy this small error could be recovered.

Trial T3 determines bits N=7 and N=8 and the control word for DAC2 is 00010000 which is exactly ¼ the previous value.

If we had seven decision thresholds such that three bits could be determined at a time then the "1" in the control word of DAC2 would move three bits per trial rather than two bits as in the above example.

A problem with using multiple conversion thresholds is that it is difficult to ensure that each of the thresholds is correctly spaced from one another. It is therefore important that the threshold generation circuits associated with each one of the comparators loads the digital to analog converters identically. This means that any scaling errors resulting from the capacitive load attached to the output of the digital to analog converters affects each of them equally. The symmetrical nature of the arrangement shown in FIG. 1 achieves this.

Each digital to analog converter and each comparator may have an offset associated with it. Naturally the circuit designer seeks to minimise the offsets through careful design and through trimming. However, optionally, each circuit may include an offset compensation device for introducing an offset voltage to the comparator so as to remove offset errors. Such circuits are known to the person skilled in the art.

Returning to FIG. 1, there are shorting switches S1 to S4 associated with the first to fourth comparators, respectively, which can connect the inverting and non-inverting inputs of an individual comparator together. This allows the voltages at the plates of the capacitors, for example 12, 14 and 16, connected to the non-inverting input to be held at a defined voltage.

Similarly shorting switches S5, S6 and S7 exist to enable the outputs of the digital to analog converters, DAC1 and DAC2 to be connected to a common node which itself could be tied to ground or a reference voltage (not shown).

Figure 4:
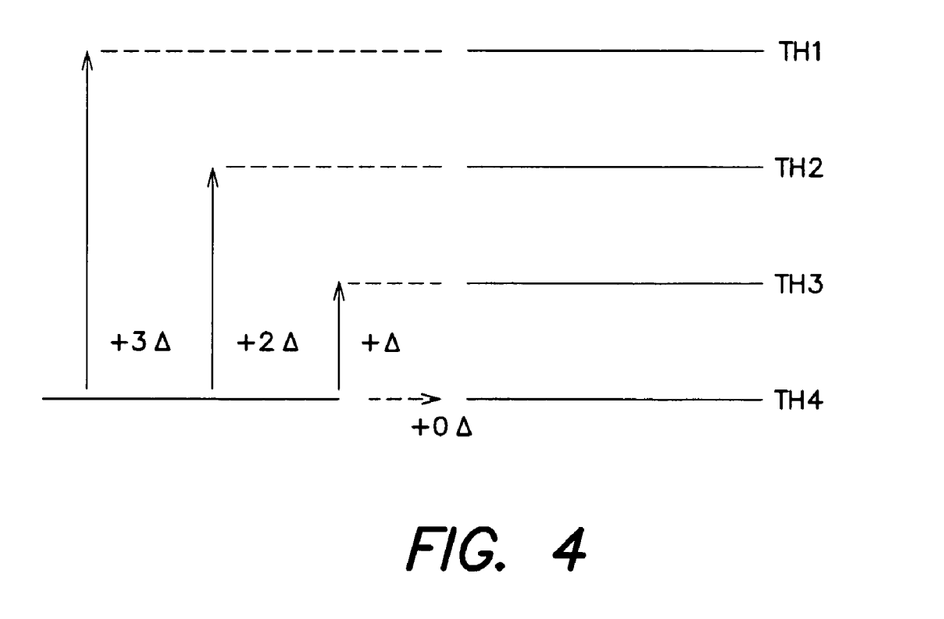
FIG. 4 schematically illustrates a further arrangement for generating a plurality of decision thresholds.

It should be noted that it is also possible to build a similar circuit in which both DAC1 and DAC2 are single ended. In this arrangement the contribution of the offset DAC, DAC2, can only be either added or subtracted (but not both) to the output of DAC1. If we suppose for simplicity that we can only add the offset to the output of DAC1, then as shown in FIG. 4 the thresholds can be generated by setting DAC1 to output a value that corresponds to the fourth threshold TH4. Thresholds TH1, TH2 and TH3 can then be generated by adding 3Δ, 2Δ and 1Δ respectively to the output of DAC1. This could be achieved by having three unit capacitors in parallel extending between the non-inverting input of the first comparator 10 and the output 22 of DAC2. Two unit capacitors extend between the non-inverting input of the second comparator 30 and the output 22 of DAC2, whereas a single unit capacitor extends between the output 22 of DAC2 and the non-inverting input of the third comparator 50. No connection is made between the fourth comparator 70 and the offset DAC, DAC2. Assuming the same full scale range for DAC and DAC2 the coupling capacitors 12, 32, 52 and 72 would be set to a value of 8 units.

The operation of the converter will now be described. Initially it is useful to consider an embodiment of the invention in which only three comparators/conversion engines are provided.

An arrangement with only three conversion thresholds can be achieved by operating the arrangement shown in FIG. 1 in a slightly modified manner and by ignoring the output C2 of either the second comparator 30 or the output C3 of the third comparator 50. We will ignore C3. Additionally, the values of the capacitors 14, 16, 34, 36, 74 and 76 all need to be the same size. Once this is achieved then the output of DAC2 will be added to the first comparator 10, will not affect the value of the second comparator 30, and will be subtracted from the fourth comparator 70. Thus the second digital to analog converter can be used to generate conversion thresholds offset from a central threshold value as output by the first digital to analog converter DAC 1.

Figure 5:
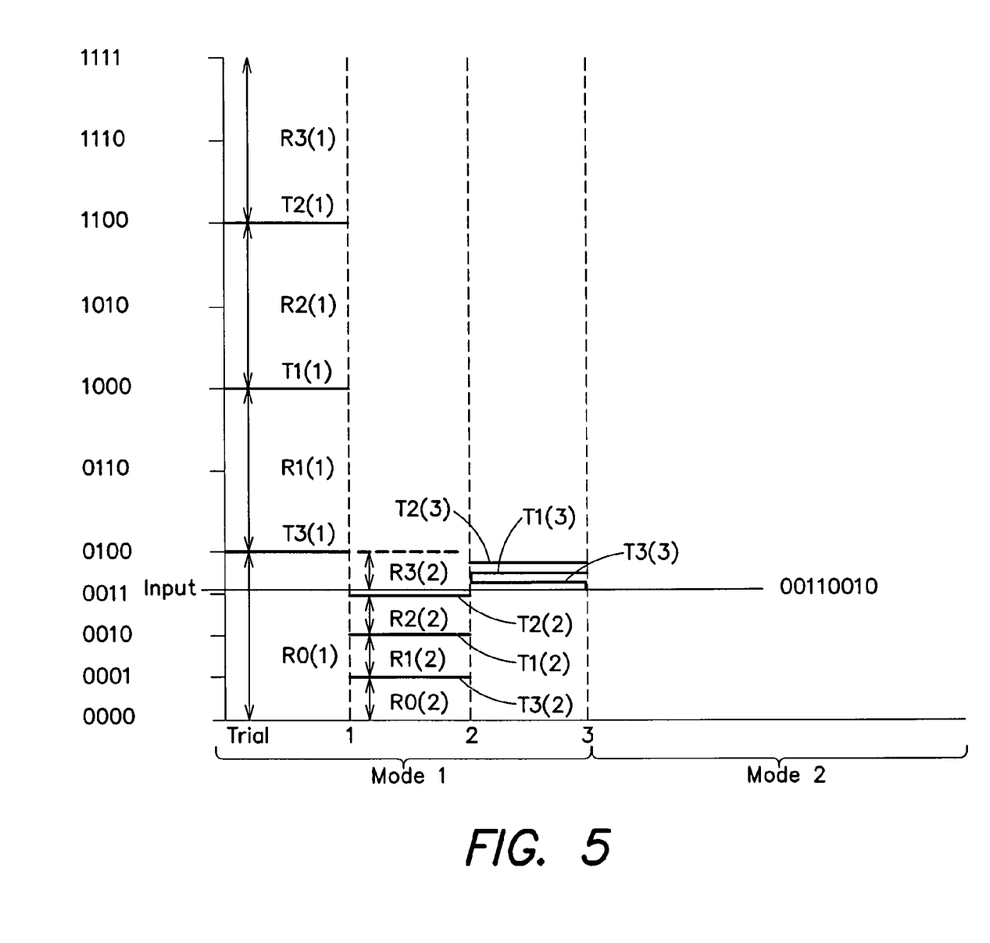
FIG. 5 schematically illustrates the conversion process for an embodiment of the present invention having three decision thresholds that can be tested simultaneously.

FIG. 5 schematically illustrates the conversion process for converting an eight bit word where the converted value of the word corresponds to "00110010". As noted before the converter is capable of converting to much greater levels of accuracy, but this example is deliberately kept simple for clarity. During the first bit trial DAC1 is set such that its two most significant bits are "10" and the rest of the bits are set to "0", this condition is designated by the line T1(1). The second digital to analog converter is set to provide an output such that the first comparator 10 tests a level offset from T1(1) by quarter of the current conversion range (which as this is the first bit trial is the input range of the converter), which is designated T2(1) and which is equivalent to a test value of "11000". Similarly the output of the second digital to analog converter DAC 2 is subtracted from the output of the first digital to analog converter DAC 1 such that the fourth comparator 70 tests a level offset from the threshold T1(1) by a value corresponding to quarter of the current conversion range, and which is designated T3(1), and which corresponds to "01000000". Thus each comparator acts as if it was an independent conversion engine, E1 to E3.

Referring to FIG. 5 it can be seen that the decision range has been segmented into four distinct regions. The lowermost region, designated R0(1) spans the lowermost quarter of the conversion space, i.e. from "00000000" to "01000000". The next region, designated R1(1) spans the next quarter of the conversion space, i.e. from "01000000" to "10000000". The next region, designated R2(1) spans the next quarter of the conversion space i.e. from "10000000" to "11000000". The final region designated R3(1) spans the range from "11000000" to full-scale, i.e. "11111111". The range of values that can be investigated can be thought of as forming a "trial space" which for this first trial extends from "00000000" to "11111111".

At the end of the first trial, the outputs of the comparators are checked and the controller notes that the analog input value is less than the threshold values T1(1), T2(1) and T3(1).

As a result, the first two bits of the trial are set to "00" and then the trial progresses to the second trial. Therefore we have already determined that the analog input signal lies within the range R0(1). As can be seen in FIG. 5, the next trial when using three comparators, acting as conversion engines only conducts further investigations within the range represented by R0(1). Thus this range extending from "00000000" to "01000000" becomes the trial space for the second trial. Thus the next two bits of the first digital to analogue converter DAC1 are set to "10" such that the value under investigation becomes "0010" as represented by the line T1(2). The output of the second converter DAC2 is reduced in value by one quarter such that it's output when added to that of the first digital to analogue converter DAC1 gives rise to a decision threshold at the first comparator 10 represented by the line T2(2). Similarly the output of the second digital to analogue converter DAC2 is also subtracted from that of the first digital to analogue converter at the fourth comparator 70 as represented by the threshold T3(2). Thus the comparators are now co-operating to check conversion ranges designated R0(2), R1(2), R2(2), and R3(2). Each of these conversion ranges is only one quarter of the size of the corresponding range in the previous trial. At the end of the second trial the controller determines that the value being converted it above the trial thresholds for each of the comparators and hence the third and fourth bits are set to "11".

As can be seen from FIG. 5, the next trial because only within the decision range R3(2), and again three thresholds are set at the quarter, half, and three-quarter distances between the top and bottom of that decision range. These thresholds are designated T1(3), T2(3) and T3(3). It can be seen from FIG. 5 that each of the decision thresholds is above the analog value. Therefore the controller discards each of these bits and hence determines that the word converted so far is "001100". Thus six bits have been converted in only three trials. However it should also be noted that any decision errors, occurring for example due to noise or settling errors, could have caused the converter to make an incorrect decision from which it would be unable to recover. This problem could be overcome by the inclusion of redundant bits, which are well known to the person skilled in the art. As result, the excess weight in the digital to analogue converter would allow it to recover from incorrectly keeping a bit which should have been discarded. However the arrangement shown in FIG. 1 when using for comparators 10, 30, 50 and 70 can allow for an extended trial range to be investigated without increasing the number of trials that have to be performed and without increasing the number of digital to analog converters required by the ADC.

In a scheme using four comparators (such that it looks as if we are using four cooperating conversion engines) the resolution of each trial remains the same as that of the three converter/comparator design. However, the use of four comparators allows the next trial range to be offset. By offsetting the thresholds by half of the (N+1)th current least significant bit (e.g. bit N=2 in trial T=1, bit N=4 in trial T=2 and so on) recovery from both previously incorrectly set or incorrectly rejected bits can be achieved.

Figure 6:
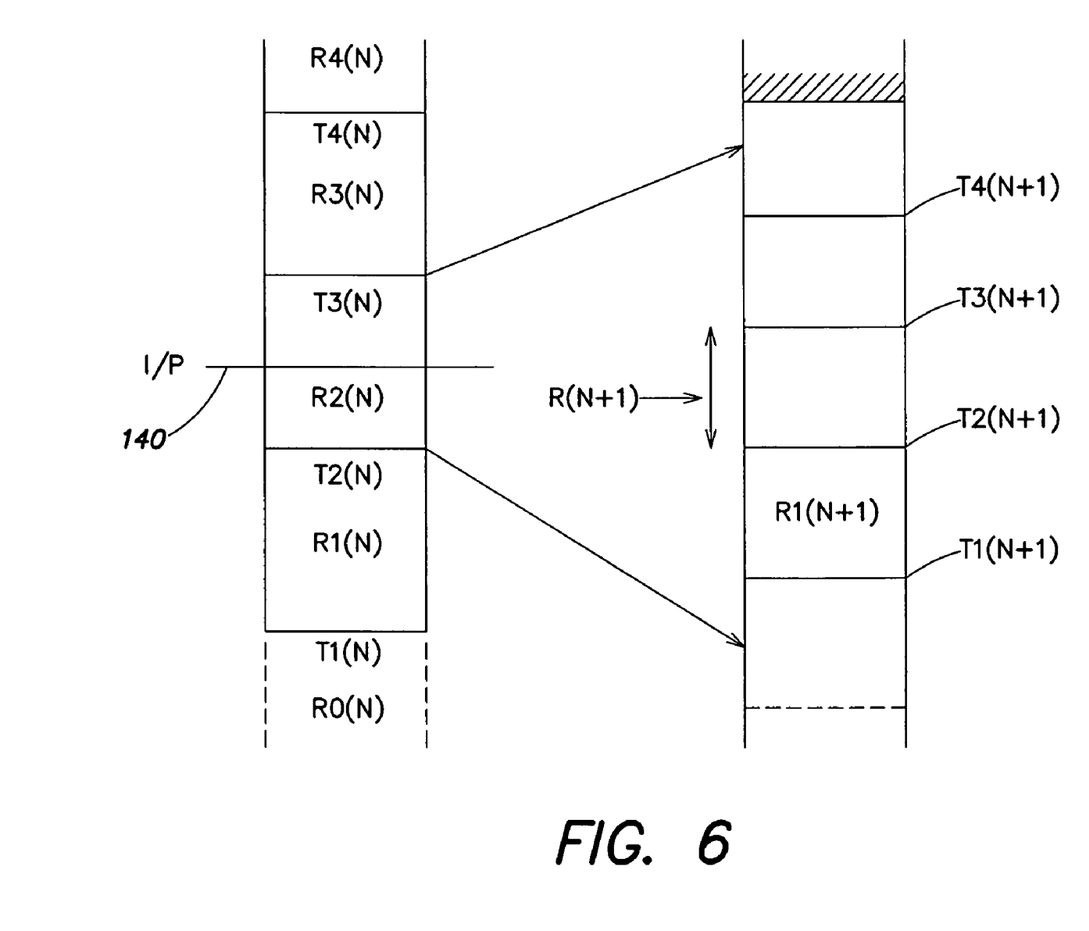
FIG. 6 schematically illustrates the conversion process for an embodiment of the present invention having four decision thresholds that can be tested simultaneously.

Consider the situation as shown in FIG. 6, where the Nth trial determines that the input value 140 lies above T2(N) and below T3(N). In the prior art, the (N+1)th trial would be restricted to further refining the result in the search space bounded by thresholds T2(N) and T3(N). However in the arrangement shown in FIG. 6 and using the converter shown in FIG. 1 each search range in the (N+1)th trial is one quarter of the size of the (N)th search spaces but the values of the thresholds have been offset, in this example downwardly by 0.5R(N+1). As a consequence the next search is made in a space that spans from T2(N)−((T2(N)−T1(N))/8) to T3(N1)+((T4(NT)−T3(N))/8).

The search range is, when necessary, truncated by the minimum and maximum values of the digital to analog converter's range.

It is useful to consider several worked examples see how it converter operates. For simplicity we will only consider the three comparator case.

Figure 7:
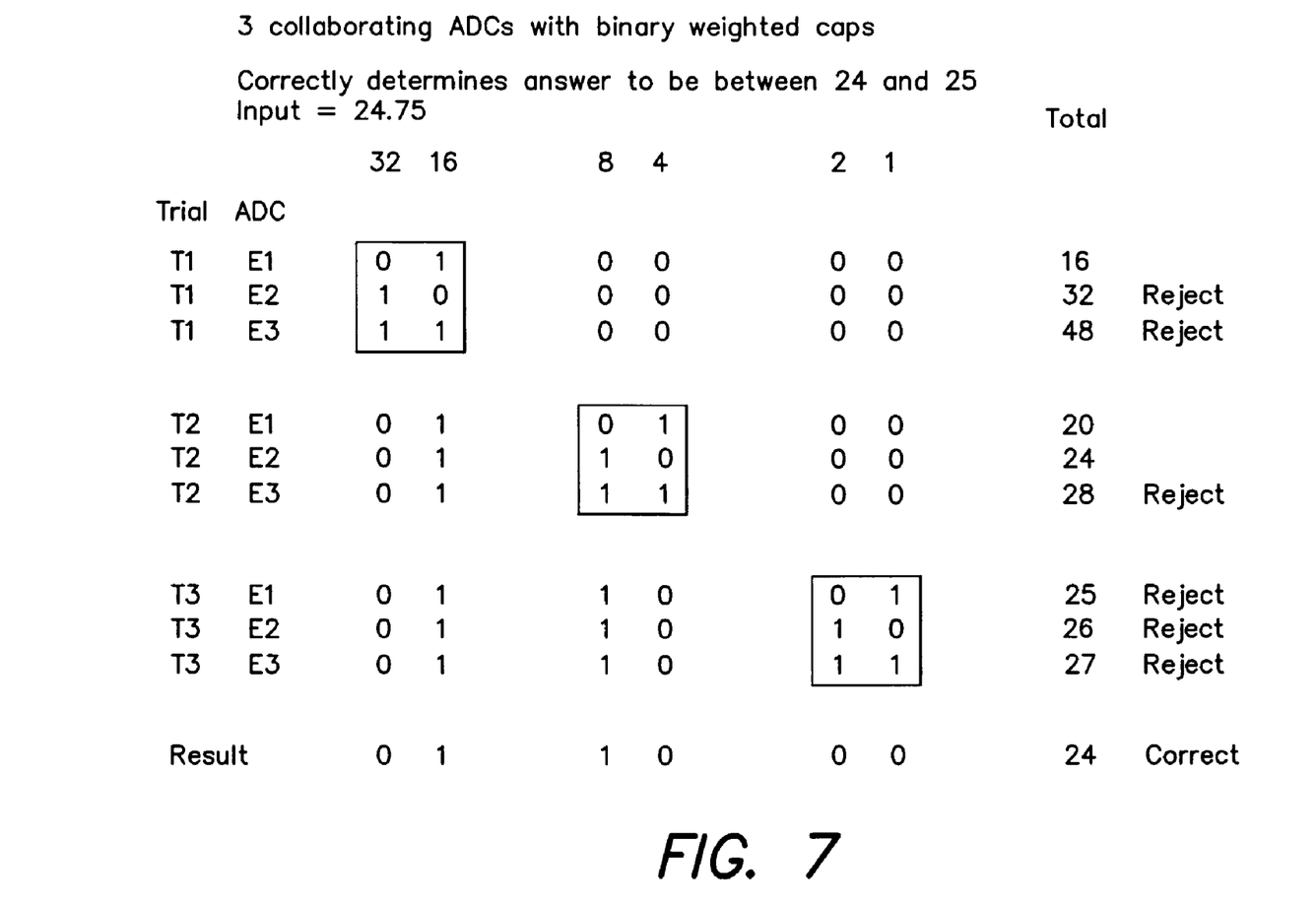
FIG. 7 shows the trial process in operation under varying conditions.

FIG. 7 shows an exemplary conversion. Each of the conversion engines comprises the shared first and second digital to analog converters, and a respective comparator and capacitor network. The capacitor networks each sum the outputs of the first and second digital to analog converters in a different way such that the summed value looks as if it has been produced by a further DAC within a conversion engine. In this arrangement each of the converter engines formed in this way has its own output value, which is related to the output values of the other converter engines. The converter engines operate in a collaborative mode to perform bit trials. The trial number is denoted by T1, T2 and T3 for the first, second and third trials respectively. Within any given trial the conversion engines are set to different bits values. Each engine is denoted E1, E2 and so on, respectively. Comparing FIGS. 7a and 7b with the three engine example discussed with respect to FIG. 5, engine E1 corresponds to the fourth comparator, engine E2 corresponds to the second comparator 30 and engine E3 corresponds to the first comparator 10.

In the example illustrated in FIG. 7, the capacitors are provided in a binary array and have weights 32, 16, 8, 4, 2 and 1. Suppose, using this array we wish to digitise an analog signal that has a value of 24.75.

In the first trial, T1, the first DAC1 is set to 100000, as is the second DAC (offset DAC) DAC2. The contribution of the offset DAC is scaled and subtracted from the first DAC such that the value presented at the fourth comparator 70 makes it behave like a first conversion engine E1 having the 32 and 16 bits set to 0 and 1 respectively. This gives a total of 16. Hence the conversion engine determines that the value it is testing is less than the analog input signal.

The output of the first DAC is sent to the second comparator 30 in unmodified form so it behaves like a second conversion engine E2 having the 32 and 16 bits set to 1 and 0 respectively, giving a value of 32, which the converter determines is too big compared to the analog input.

The output of the offset DAC DAC2 is scaled and added to the output of DAC1 and presented to the first comparator 10 such that it behaves like a third conversion engine having its 32 and 16 bits set to 1 and 1 respectively, giving a value of 48 which is also too big.

As only E1 had a value which was less than the analog value, its bits 01, are carried forward to the second test.

In the second trial, T2 each engine has its 32 and 16 bits set to 0 and 1 respectively. The next most significant bits having weights 8 and 4 are tested with each engine repeating the 01 for E1, 10 and E2 and 11 for E3 sequence. This is achieved by setting DAC1 to 011000 and DAC2 to 001000. In this trial both E1 and E2 have values less than the analog value being tested. Thus E3 is discarded and the higher value of E1 and E2, i.e. E2, is kept and taken forward to the next trial. This number corresponds to the value 24. Thus for the third trial the four most significant bits of DAC1 are set to '0110' so the trial words for the third trial are DAC1=011010 and DAC2=000010.

In the third trial all of the trials are discarded because each has a value greater then the value being tested. Therefore, in this example "01 10 00" is the correct answer.

It can be seen that three bits could be set in one go using the principle of the present invention. This would require a minimum of 23−1=7 converter engines but preferably $2^3$ converter engines would be provided so as to provide for range extension. In fact it can be seen that the trial space under investigation can be reduced by $1/2^n$ where n is the number of bits being determined at the bit trial.

Figure 8:
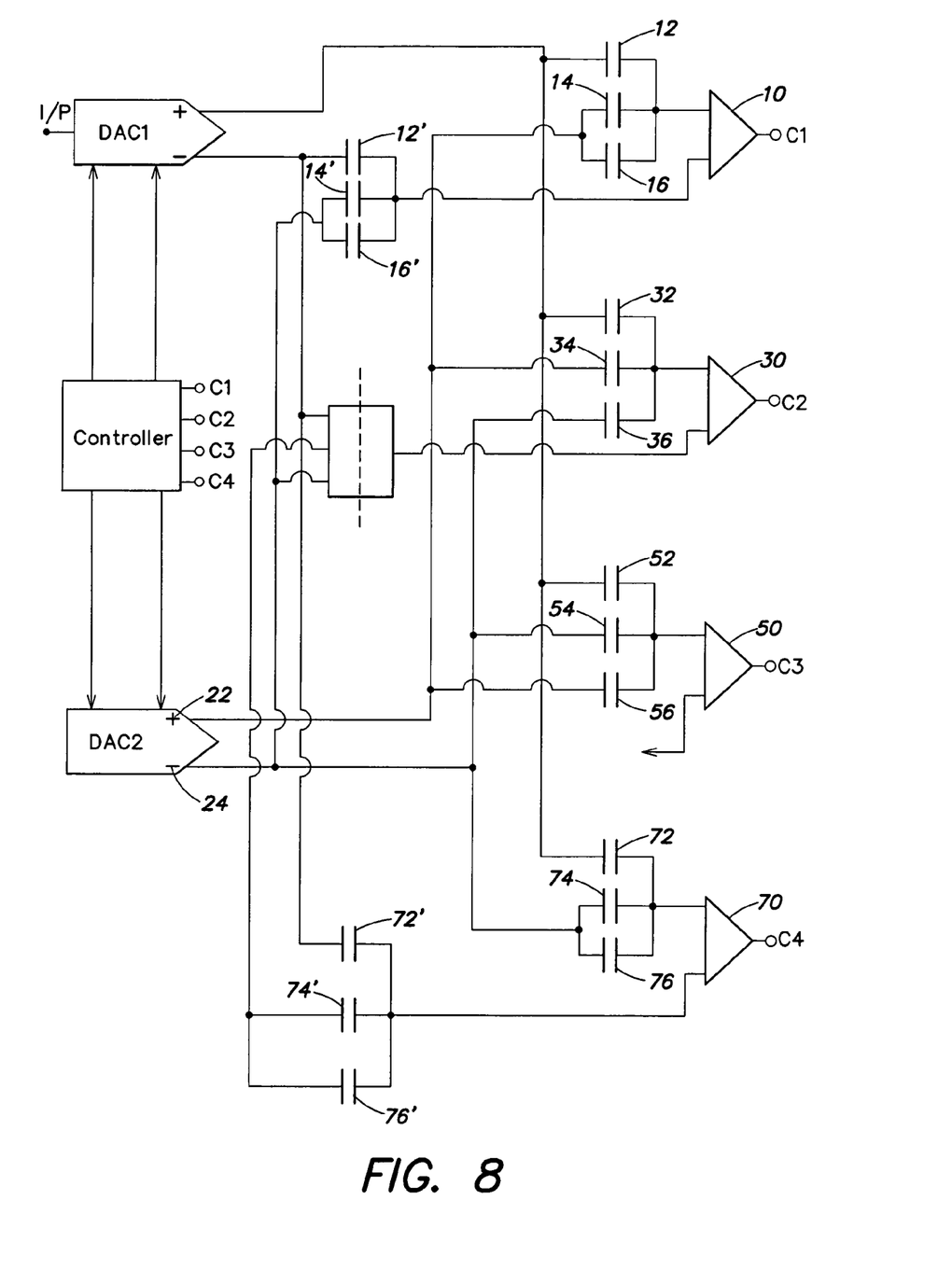
FIG. 8 shows a differential converter topology constituting an embodiment of the invention.

The invention can also be implemented in a fully dual ended manner, as shown in FIG. 8. FIG. 8 is similar to FIG. 1 and like parts have been given like reference numerals. However now each inverting input of the comparators is also connected to DAC1 and DAC2 via capacitive voltage divider networks. Capacitors in these networks are designated with an apostrophe, so capacitor 12' connects in inverting input of comparator 10 to the inverting output of DAC1. Capacitors 14' and 16' connect to the inverting output of DAC2 rather than the non-inverting output as was the case for capacitors 14 and 16. Thus each capacitor 12, 14, 16, 32, 34, 36, 52, 54, 56, 72, 74, 76 is mirrored by 12', 14', 16' and so on where the apostrophe denotes both that the capacitor is connected to the inverting input of its associated comparator and that the connection is swapped between the non-inverting and inverting output of the DACs compared to equivalently numbered capacitor not having an apostrophe. The shorting switches have been omitted for simplicity but would be provided in positions analogous to those shown in FIG. 1.

Figure 9:
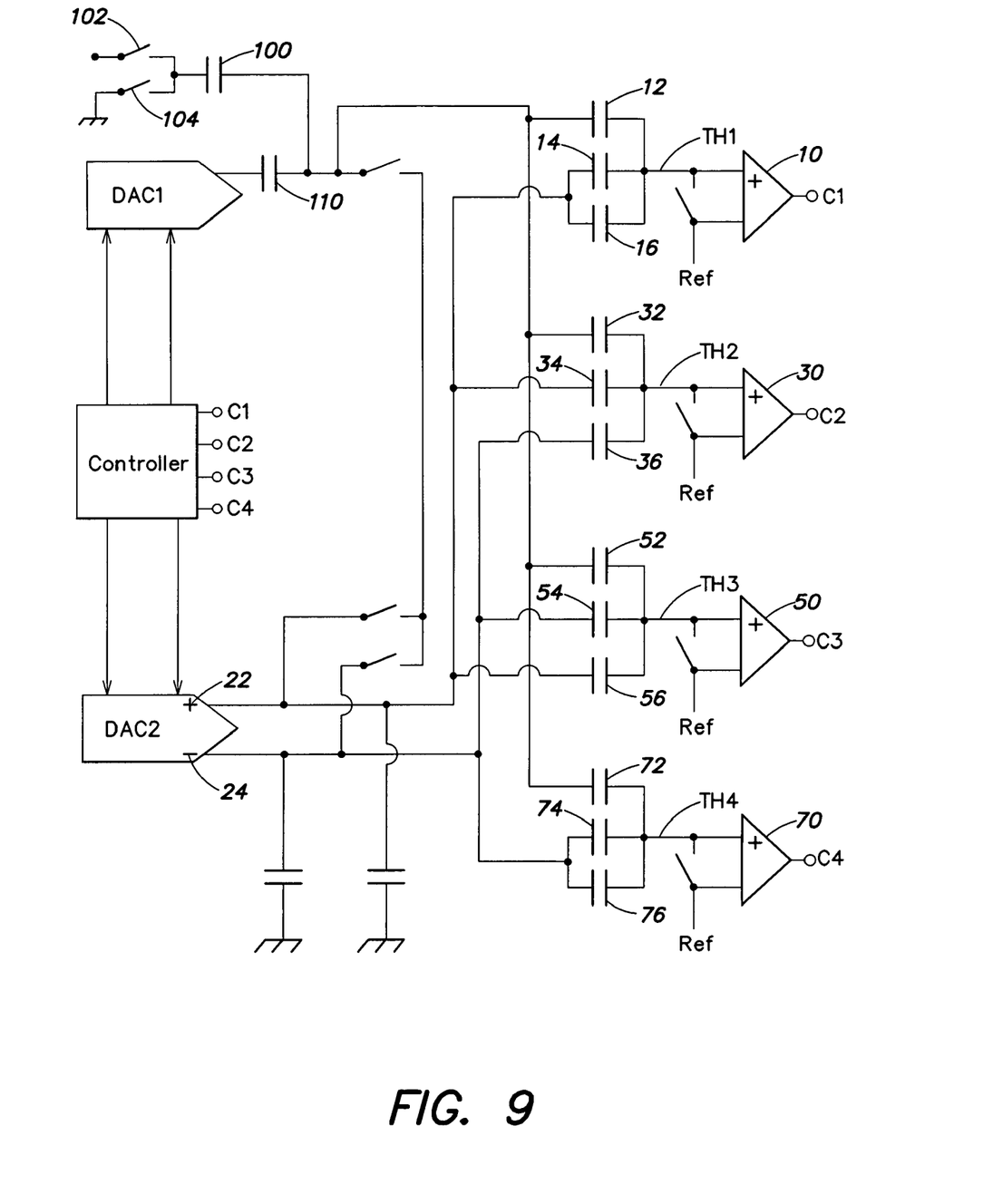
FIG. 9 shows a further embodiment of the invention.

FIG. 9 shows a modification to the circuit shown in FIG. 1. A separate sampling capacitor 100, in association with sampling switch 102 and discharge switch 104, is provided so as to sample the analog input signal that is to be digitised.

Optionally a further coupling capacitor 110 may be provided at the output of DAC1 so as to attenuate the output of that DAC. This may be required where the input signal is fairly small in comparison with the range of the DAC output and the designer wants to limit the size of the capacitor C100.

As shown in FIG. 1, shorting switches, for example S1, are provided to define the voltage at the comparator inputs prior to starting the conversion. Switches S5, S6 and S7 are used to set the voltages at the outputs of the DACs where the DACs are capacitor DACs. S5 also provides correct sampling of the input signal where DAC1 also serves as the input sampling network. During an acquire phase all switches shown in FIG. 1 are closed and during a conversion phase all switches are open. It may be beneficial to open S6 and S7 before all the other switches as then any pedestal error at the output of DAC2 is zeroed out by the capacitors between the comparator inputs and DAC2. Switches S1 through S4 should be opened prior to opening switches S5 while the voltage across all the capacitors shown in FIG. 1 are still defined.

Where the comparators also include auto-zeroing circuits switches SI through S4 also serve to define the comparator inputs during an auto-zero phase. In the comparator architecture shown in FIG. 10, switches 150 and 132 provide the same function as switches S1 through S4 in FIG. 1. The capacitors 12, 14 and 16 along with 12', 14' and 16' also act as an auto zeroing capacitor to hold the input offset of the comparators. The input stage comprises a current source 122 connected to the sources of first and second field effect transistors 124 and 126 arranged as a long tailed pair. The drain of the transistor 124 is connected to a positive supply rail 128 via a load 130. Similarly a second load 132 extends between the drain of the transistor 126 and the supply rail 128.

Figure 10:
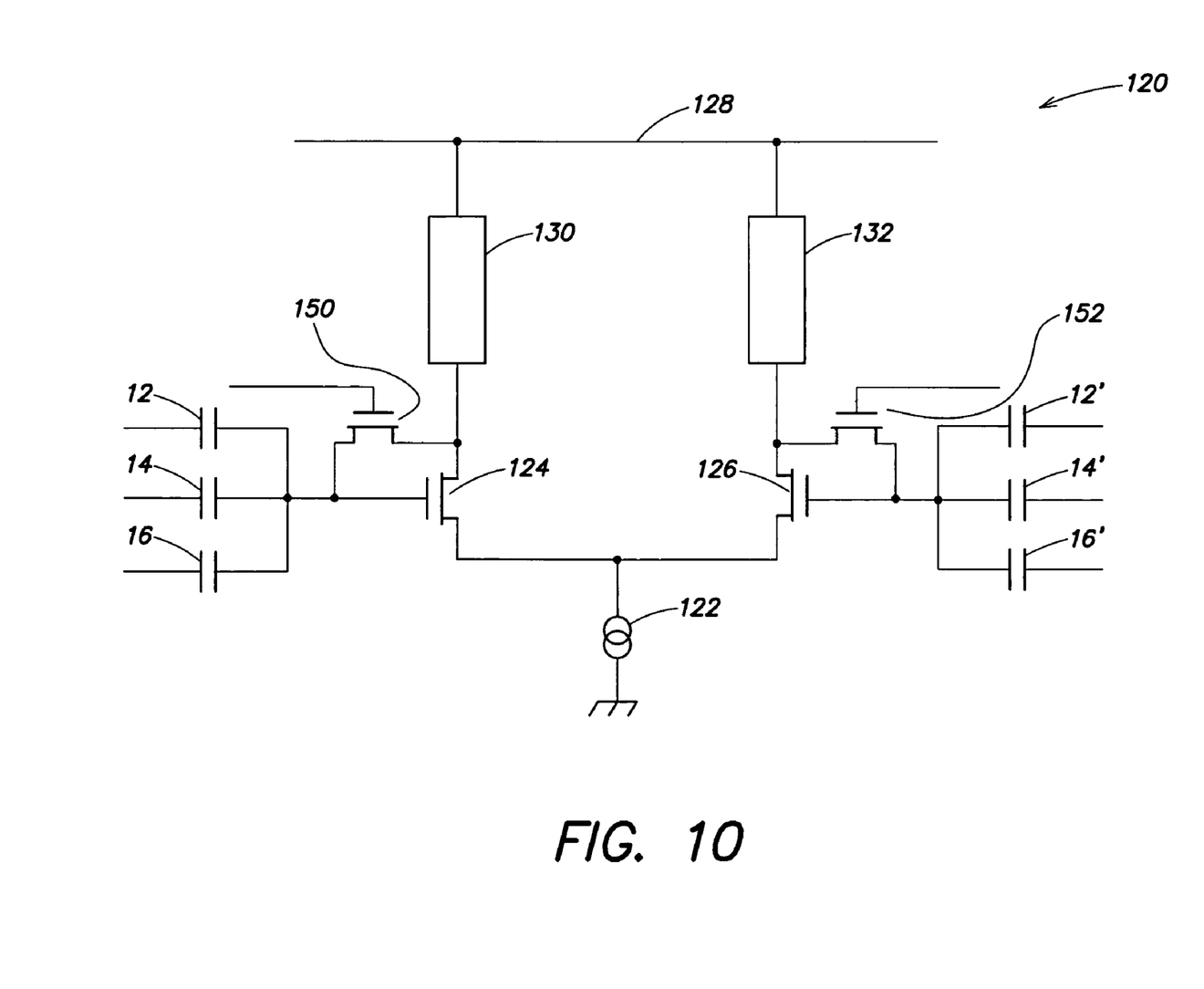
FIG. 10 shows a comparator input stage with an input shorting arrangement.

The gate of each transistor is connected to receive a respective input to the comparator. Thus, if transistor 124 represents the non-inverting input, then its gate is connected to the capacitors 12, 14 and 16 of FIG. 1. Consequently if transistor 126 represents the non-inverting input then its gate is either connected to ground in the single ended arrangement shown in FIG. 1 or to further capacitors 12', 14' and 16' in the differential arrangement shown in FIG. 8. It is this latter configuration which is illustrated in FIG. 10. In order to connect the inputs together a first shorting transistor 150 extends between the gate and drain of the transistor 124. A second shorting transistor 152 extends between the gate and drain of the transistor 126. The transistor 150 and 152 are normally in a non-conducting state so as not to perturb the operation of the comparator input state. However, if both transistors 150 and 152 are switched on, the they can cause transistors 124 and 126 to be switched hard on effectively causing the gate of transistor 124 to be connected to the gate of transistor 126 via a low impedance path formed by transistors 150, 124, 126 and 152. In this arrangement, the DC impedance of at the input to the comparator while switches 150 and 152 are in their on state is defined not by their on resistance but instead by the gm of the devices 124 and 126. As a result these switches can be made to be very small and hence any offset introduced by charge injection as these switches turn off, is minimised.

It is thus possible to provide multiple decision thresholds for a successive approximation analog to digital conversion, either SAR or pipelined, using only two digital to analog converters. For a pipeline converter, two ADC's are provided at each stage of the pipeline.

The invention claimed is:

1. A successive approximation analog to digital converter comprising first and second digital to analog converters, at least three comparators and a capacitive summing network for simultaneously forming at least first to third combinations of outputs from the first and second digital to analog converters such that at least three decision thresholds can be tested at the same time, and wherein the summing network comprises capacitors connected in series between an output of each digital to analog converter and a respective summing node, the second digital to analog converter is a dual ended device having first and second complementary outputs, and one of the first and second complementary outputs is connected to the respective summing node by a first capacitor and the other of the first and second complementary outputs or the same one of the first and second complementary outputs is connected to the respective summing node by a second capacitor.

2. A successive approximation analog to digital converter as claimed in claim 1, in which the second capacitor has half the capacitance of the first offset capacitor.

3. A successive approximation analog to digital converter as claimed in claim 1, in which an Nth comparator has a first input thereof connected to a first output of the first digital to analog converter by a first respective impedance, and connected to a first output of the second digital to analog converter by a second respective impedance such that the voltage occurring at the first input is a weighted sum of outputs of the first and second digital to analog converters, where N is an integer.

4. A successive approximation analog to digital converter as claimed in claim 3, in which the Nth comparator further has a third respective impedance connecting the first input of the comparator to a second output of the second analog to digital converter.

5. A successive approximation analog to digital converter as claimed in claim 1, in which each comparator tests a respective decision threshold, such that a plurality of bits can be determined in a single trial.

6. A successive approximation analog to digital converter as claimed in claim 1, further including redundant bits.

7. A successive approximation analog to digital converter as claimed in claim 1, in which the first and second digital to analog converters are switched capacitor devices.

8. A successive approximation analog to digital converter as claimed in claim 7, in which the first digital to analog converter is further adapted to sample an analog value onto at least one capacitor therein.

9. A successive approximation analog to digital converter as claimed in claim 1, in which, for a Tth conversion a value of a trial word presented to the first digital to analog converter is modified by an amount which varies with the value of T such that the combinations of outputs from the first and second digital to analog converters are combined by the summing networks to form the decision thresholds.

10. A successive approximation analog to digital converter as claimed in claim 1, in which the capacitive summing network loads each digital to analog converter equally such that the relative matching of the digital to analog converters remains the same.

11. A successive approximation analog to digital converter as claimed in claim 1, in which between one bit trial and an immediately subsequent bit trial the output of the second digital to analog converter is reduced by $\frac{1}{2}^n$, where n is the number of bits being determined in each bit trial.

12. An analog to digital converter as claimed in claim 1, in which in a $T_{th}$ conversion trial the output of the first digital to analog converter is modified so as to offset it by an amount which varies as a function of T.

13. A successive approximation analog to digital converter comprising first and second digital to analog converters, at least three comparators and a capacitive summing network for simultaneously forming at least first to third combinations of outputs from the first and second digital to analog converters such that at least three decision thresholds can be tested at the same time, and in which between a Tth conversion and a T+1th conversion the value of a analog voltage output by the second digital to analog converter is reduced by three quarters.

14. A method of performing a successive approximation analog to digital conversion in which an Tth conversion trial determines at least two bits, the method comprising setting a first value in a first digital to analog converter and a second value in a second digital to analog converter and simultaneously combining the outputs in a combinational device so as to form at least three decision thresholds, where T is a positive integer, and in which the combinational device comprises a plurality of voltage dividers so as to form the decision thresholds simultaneously, and during a (T+1)th conversion trial the contribution from the second digital to analog converter is one quarter of the contribution that it provided during the Tth conversion trial.

15. A method as claimed in claim 14, in which during a Tth trial the output of the first digital to analog converter is modified so as to offset it by an amount which varies as a function of T.

16. An analog to digital converter comprising first and second digital to analog converters, at least three comparators and a capacitive summing network for forming at least first to third combinations of outputs from the first and second digital to analog converters such that at least three decision thresholds can be tested at the same time, in which the second digital to analog converter is a dual ended device, and a first one of its outputs is connected to a summing node associated with a first comparator, but the second output is not, and the second one of the outputs is connected to a summing node associated with a second comparator but the first is not.

17. An analog to digital converter comprising first and second digital to analog converters, at least three comparators and a capacitive summing network for forming at least first to third combinations of outputs from the first and second digital to analog converters such that at least three decision thresholds can be tested at the same time, and in which when progressing from one bit trial to an immediately subsequent bit trial the size of the trial space under investigation is reduced by $\frac{1}{2}^n$ where n is the number of bits being determined in each bit trial.

18. An analog to digital converter comprising first and second digital to analog converters, at least three comparators and a capacitive summing network for forming at least first to third combinations of outputs from the first and second digital to analog converters such that at least three decision thresholds can be tested at the same time, in which the summing network comprises capacitors connected in series between an output of each digital to analog converter and a respective summing node, the second digital to analog converter is a dual ended device having first and second complementary outputs, and one of the first and second complementary outputs is connected to the respective summing node by a first capacitor and the other of the first and second complementary outputs or the same one of the first and second complementary outputs is connected to the respective summing node by a second capacitor.

19. An analog to digital converter as claimed in claim 18, in which the second capacitor has half the capacitance of the first offset capacitor.

20. An analog to digital converter comprising first and second digital to analog converters, at least three comparators and a capacitive summing network for forming at least first to third combinations of outputs from the first and second digital to analog converters such that at least three decision thresholds can be tested at the same time, and in which between one bit trial and an immediately subsequent bit trial the output of the second digital to analog converter is reduced by $\frac{1}{2}^n$, where n is the number of bits being determined in each bit trial.

21. A method of performing an analog to digital conversion in which an Tth conversion trial determines at least two bits, the method comprising setting a first value in a first digital to analog converter and a second value in a second digital to analog converter and combining the outputs in a combinational device so as to form at least three decision thresholds, where T is a positive integer, in which during a (T+1)th conversion trial the contribution from the second digital to analog converter is one quarter of the contribution that it provided during the Tth conversion trial.

* * * * *